(12) United States Patent
Kojima (10) Patent No.: US 7,372,315 B2
(45) Date of Patent: May 13, 2008

(54) SWITCHING CIRCUIT USING SEMICONDUCTOR SWITCHING ELEMENT

(75) Inventor: Haruo Kojima, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 187 days.

(21) Appl. No.: 11/420,341

(22) Filed: May 25, 2006

(65) Prior Publication Data

US 2006/0267667 A1 Nov. 30, 2006

(30) Foreign Application Priority Data

May 26, 2005 (JP) ............................. 2005-154180

(51) Int. Cl.
*H03K 17/687* (2006.01)
(52) U.S. Cl. ...................................... 327/427; 327/430
(58) Field of Classification Search .............. 327/427, 327/430
See application file for complete search history.

(56) References Cited

U.S. PATENT DOCUMENTS

| | | | | |
|---|---|---|---|---|
| 5,021,691 | A | * | 6/1991 | Saito ............................ 326/69 |
| 5,115,143 | A | * | 5/1992 | Rohulich et al. ............ 327/109 |
| 6,396,325 | B2 | * | 5/2002 | Goodell ........................ 327/308 |
| 6,552,445 | B1 | * | 4/2003 | Yang ............................ 307/38 |
| 6,873,062 | B1 | * | 3/2005 | Makino ........................ 307/126 |
| 7,068,109 | B2 | * | 6/2006 | Woodford ..................... 330/297 |
| 2006/0091932 | A1 | * | 5/2006 | Farjad-rad .................... 327/427 |
| 2006/0267667 | A1 | * | 11/2006 | Kojima ........................ 327/427 |

FOREIGN PATENT DOCUMENTS

| | | |
|---|---|---|
| JP | 8-46502 | 2/1996 |
| JP | 2002-152034 | 5/2002 |

* cited by examiner

*Primary Examiner*—Quan Tra
*Assistant Examiner*—Ryan C. Jager
(74) *Attorney, Agent, or Firm*—Oblon, Spivak, McClelland, Maier & Neustadt, P.C.

(57) ABSTRACT

A switching circuit includes a semiconductor switching element having a control electrode and a source-drain current path, the source-drain current path being connected between a voltage source and a load circuit, a parallel circuit formed by first and second transistors having respective collector-emitter paths connected between the control electrode of the semiconductor switching element and a reference potential point, a first resistor connected to the second transistor in series, a differential circuit connected between a control signal terminal and the base of the first transistor and a second resistor connected between the control signal terminal and the base of the second transistor. The first transistor is made conductive by a signal obtained by differentiating a control signal and subsequently the second transistor is made conductive to control the semiconductor switching element for ON/OFF.

17 Claims, 6 Drawing Sheets

SWITCHING CIRCUIT USING SEMICONDUCTOR SWITCHING ELEMENT

CROSS-REFERENCE TO RELATED APPLICATION

This application is based upon and claims the benefit of priority from the prior Japanese Patent Application No. 2005-154180, filed on May 26, 2005, the entire contents of which are incorporated herein by reference.

BACKGROUND OF THE INVENTION

1. Field of the Invention

This invention relates to a switching circuit and, more particularly, it relates to a switching circuit using a semiconductor element as a switching element and adapted to drive and control the switching element by means of a pulse signal.

2. Description of the Related Art

Switching circuits comprising a semiconductor element that operates as a switching element and is designed to be driven by a pulse signal are known. The switching circuit may typically be an FET (field effect transistor). Then, the source electrode of the FET is connected to a power source and the drain electrode thereof is connected to a load circuit while a control signal is supplied to the gate electrode thereof so that the FET is controlled for ON/OFF by the control signal. When a pulse signal is supplied as control signal, the FET is held ON to supply a voltage to the load circuit only in a pulse period.

Meanwhile, such a switching circuit is required to have good switching characteristics when the switching element of the switching circuit is driven by a pulse. Particularly, when it is driven at high speed by a pulse signal, it is necessary to make the rise time and the fall time satisfactorily short.

Figure 6A:
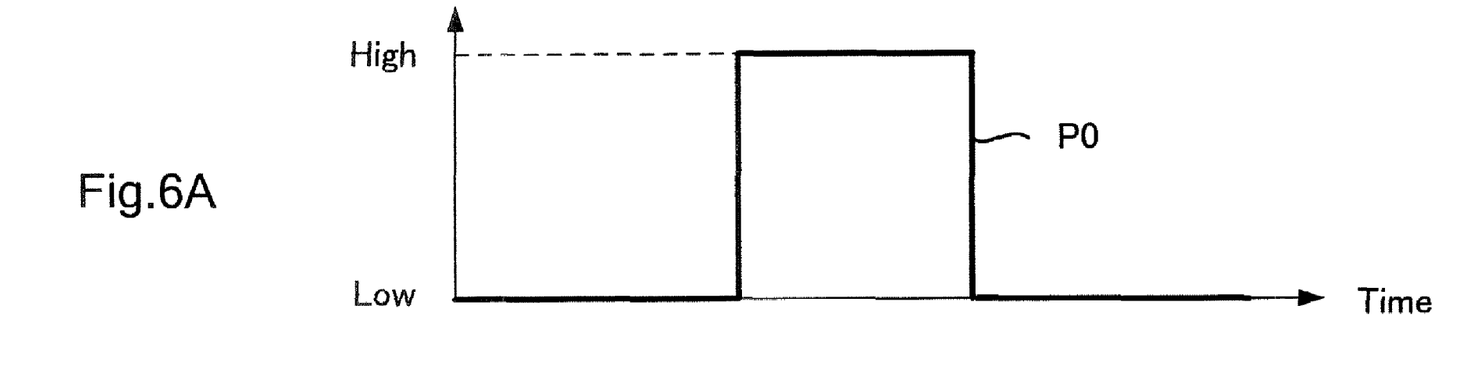
FIG. 6A and FIG. 6B are graphs of waveforms of a known switching circuit, illustrating the switching characteristics thereof.
Figure 6B:
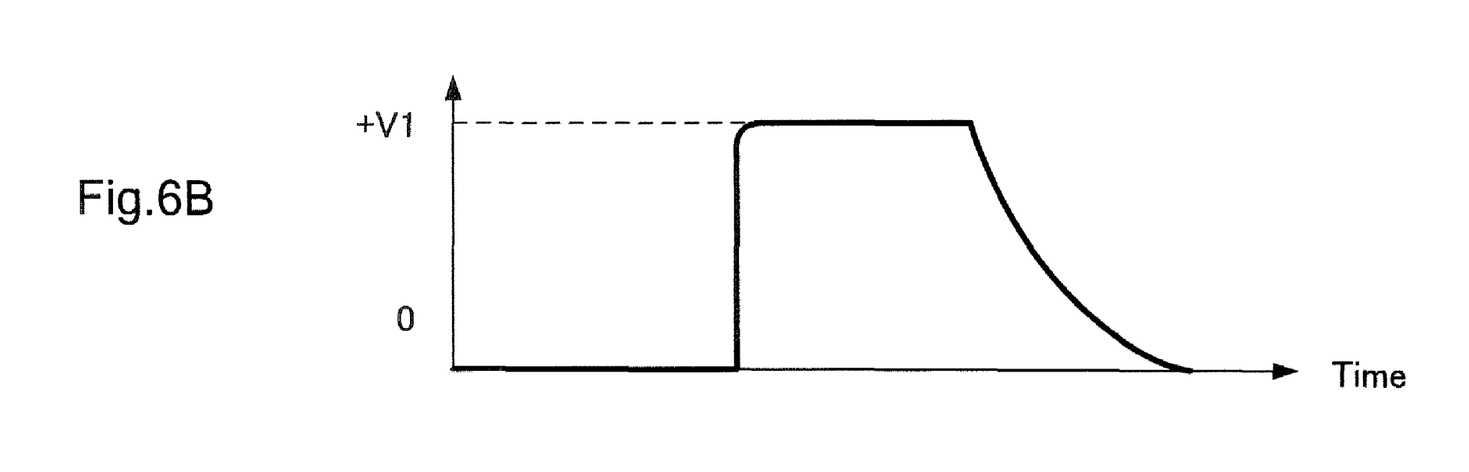

FIGS. 6A and 6B of the accompanying drawings show waveforms of a known switching circuit, illustrating the switching characteristics thereof. FIG. 6A shows a control signal P0 that is supplied to the control electrode of the switching element. The switching element is turned from OFF to ON when the level of the control signal P0 is raised from level Low to level High. As the switching element is held ON, a voltage is supplied to the load circuit during the ON period.

FIG. 6B shows the voltage waveform+V1 of the voltage supplied to the load circuit. While the voltage waveform+V1 rises and falls to show a waveform same as that of the control signal P0, in reality, both the rise and the fall of the switching element show a time lag due to the characteristics of the switching element. Then, there arises a problem that the waveform of the output voltage+V1 becomes blunt at the rise time and also at the fall time.

Jpn. Pat. Appln. Laid-Open Publication No. 8-46502 describes a transistor circuit showing improved rising and falling characteristics of a switching element thereof. In an embodiment of transistor circuit described in the above-cited patent document, the rise time is reduced by supplying a pulse signal to the base of the switching circuit by way of a parallel circuit of a resistor and a capacitor. In this embodiment, when the level of the pulse signal is raised from level Low to level High to turn the switching element from OFF to ON, the transistor rises very rapidly under the effect of the capacitor so that it shows a short rise time.

However, a long fall time is required to the transistor to make the switching element show bad falling characteristics when the level of the pulse signal falls from level High to level Low to turn the switching element from ON to OFF because of the large discharge time constant of the capacitor. Additionally, the above-cited patent document describes an instance of connecting two switching elements in series and driving them alternately in order to improve the rising and falling characteristics of the transistor. However, such an arrangement makes the circuit configuration a complex one.

Jpn. Pat. Appln. Laid-Open Publication No. 2002-152034 describes a switching circuit with improved falling characteristics that is realized by connecting a P-channel FET and an N-channel FET in series and driving the two FETs by means of a bipolar transistor and a differential circuit. However, the above-cited patent document does not describe any means for improving the rising characteristics. Additionally, the use of two FETs also makes the circuit configuration a complex one.

Thus, the present invention provides a switching circuit comprising a semiconductor element that operates as a switching element and showing excellent switching characteristics when driving the switching element by a pulse signal.

BRIEF SUMMARY OF THE INVENTION

According to an aspect of the present invention, there is provided a switching circuit including: a semiconductor switching element having an input electrode, an output electrode and a control electrode, the input electrode being connected to a voltage source, the output electrode being connected to a load circuit; a first transistor with its collector-emitter path connected between the control electrode of the semiconductor switching element and a reference potential point; a series circuit including a second transistor and a first resistor connected to a collector-emitter path of the second transistor in series and connected to the first transistor in parallel; a control signal terminal configured to be supplied with a control signal shifting between a first level and a second level; a second resistor connected between the control signal terminal and the base of the second transistor; and a differential circuit including a first capacitor and a third resistor in series and connected between the control signal terminal and a base of the first transistor, wherein the semiconductor switching element is controlled for ON/OFF in response to the control signal.

According to another aspect of the present invention, there is provided a switching circuit including: a semiconductor switching element having an input electrode, an output electrode and a control electrode, the input electrode being connected to a voltage source, the output electrode being connected to a load circuit; a first transistor with its collector-emitter path connected between the control electrode of the semiconductor switching element and a reference potential point; a series circuit including a second transistor and a first resistor connected to a collector-emitter path of the second transistor in series and connected to the first transistor in parallel; a control signal terminal configured to be supplied with a control signal shifting between a first level and a second level; a second resistor connected between the control signal terminal and a base of the second transistor; a first differential circuit including a first capacitor and a third resistor in series and connected between the control signal terminal and a base of the first transistor so as to make the first transistor conductive at a time of the level shift of the control signal from the first level to the second level; a parallel circuit including a fourth resistor connected between the input electrode and the control electrode of the semiconductor switching element and a third transistor with its emitter-collector path connected to the fourth resistor in parallel; and a second differential circuit including a second capacitor and a fifth resistor in series and connected between the control signal terminal and a base of the third transistor so as to make the third transistor conductive at the time of the level shift of the control signal from the second level to the first level, the semiconductor switching element being controlled for ON/OFF in response to the control signal.

DETAILED DESCRIPTION OF THE INVENTION

Now, the present invention will be described in greater detail by referring to the accompanying drawings that illustrate preferred embodiments of the present invention. Throughout the drawings, the circuit elements having the same functional feature are denoted by a same reference symbol.

Figure 1:
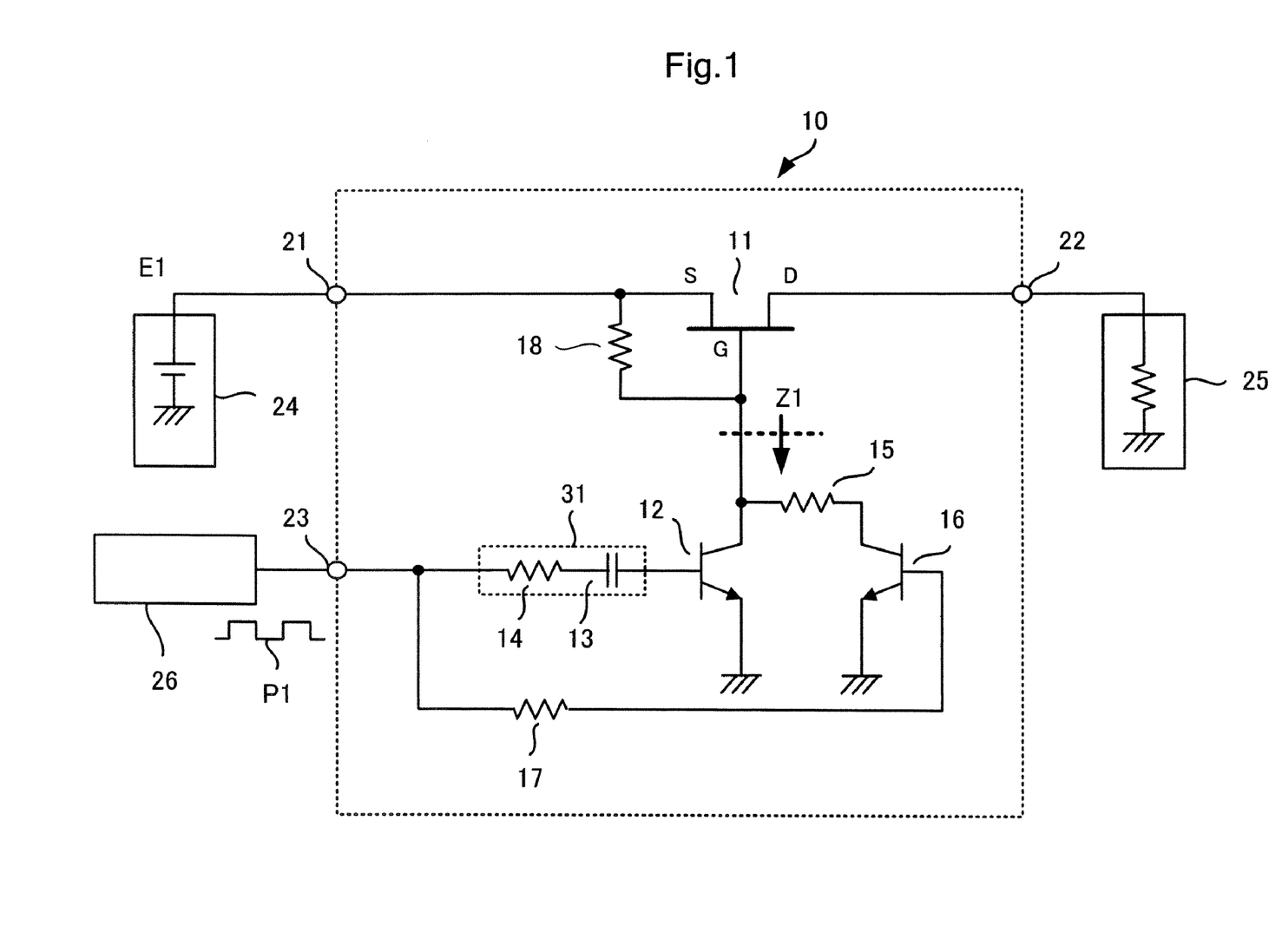
FIG. 1 is a schematic circuit diagram of an embodiment of a switching circuit according to the present invention.

FIG. 1 is a schematic circuit diagram of an embodiment of a switching circuit according to the present invention, illustrating the configuration thereof. Referring to FIG. 1, 10 denotes the switching circuit, in which the main conduction path (source-drain current path) of its semiconductor switching element 11 is connected between its input terminal 21 and its output terminal 22. In this embodiment, a P-channel MOS type FET is used for the semiconductor switching element 11. Of the semiconductor switching element 11, the input electrode (source electrode S) is connected to the input terminal 21 and the output electrode (drain electrode D) is connected to the output terminal 22.

The switching element 11 performs a switching operation according to the control signal supplied to the gate electrode that operates as a control electrode. The gate electrode G of the switching element 11 is connected to the collector of an NPN transistor 12. The emitter of the transistor 12 is connected to a reference potential point (earth) while the base of the transistor 12 is connected to one of the opposite ends of a differential circuit 31 that is a series circuit of a capacitor 13 and a resistor 14. The other end of the differential circuit 31 is connected to a control signal terminal 23. Note that, while the capacitor 13 of the differential circuit 31 is connected to the base of the transistor 12 in FIG. 1, the resistor 14 thereof may alternatively be connected to the base of the transistor 12.

The gate electrode of the switching element 11 is connected to the collector of a transistor 16 by way of a resistor 15 and the emitter of the transistor 16 is connected to the reference potential point. The base of the transistor 16 is connected to the control signal terminal 23 by way of a resistor 17, and resistor 18 is connected between the source electrode S and the gate electrode G of the switching element 11.

Also referring to FIG. 1, a DC voltage E1 is supplied from a constant voltage source 24 to the input terminal 21 while a load circuit 25 is connected to the output terminal 22. Control signal P1 is supplied from a control signal source 26 to the control signal terminal 23 and the switching element 11 performs a switching operation in response to the control signal P1 and supplies the DC voltage E1 that is supplied to the input terminal 21 to the load circuit 25 that is connected to the output terminal 22. Not that, in FIG. 1, the load circuit 25 is represented by a resistor.

Figure 2A:
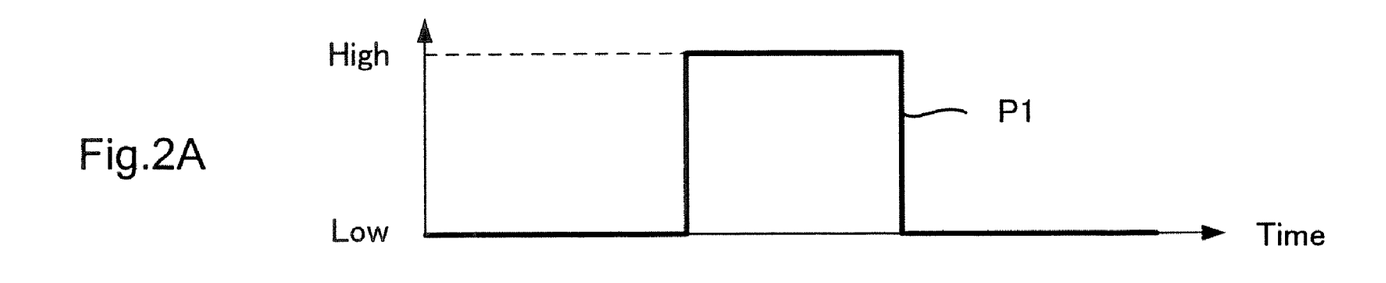
FIG. 2A is a graph of the waveform of the control signal of the switching circuit of FIG. 1, illustrating the operation thereof.

Now, the operation of the switching circuit of FIG. 1 will be described by referring to the waveforms of FIGS. 2A through 2C. FIG. 2A is a graph of the waveform of the control signal (pulse signal P1) supplied to the control signal terminal 23 and FIG. 2B is a graph of a waveform, illustrating the change in the impedance 21 of the gate electrode G of the switching element 11, while FIG. 2C is a graph of the waveform of the voltage between the opposite ends of a load circuit 25.

Firstly, referring to FIG. 2A, as a pulse signal P1 is applied as control signal to the control signal terminal 23 and the level of the pulse signal P1 shifts from level Low to level High, a base current flows to the base of the transistor 12 by way of the differential circuit 31 that includes the resistor 14 and the capacitor 13. The base current flows until the capacitor 13 is charged, in other words, during the differential period of the rise of the pulse signal P1. Then, the transistor 12 rapidly comes into a conductive state in response to the rise of the pulse signal P1 and then moves into a non-conductive state because the base current no longer flows.

On the other hand, the pulse signal P1 is supplied at the same time to the base of the transistor 16 by way of the resistor 17 so that a base current begins to flow. Then, the transistor 16 comes into a conductive state after a transitional response time that is a function of its own response characteristics. As a result, the switching element 11 is turned ON to supply the voltage E1 of the constant voltage source 21 to the load circuit 26.

Figure 2B:
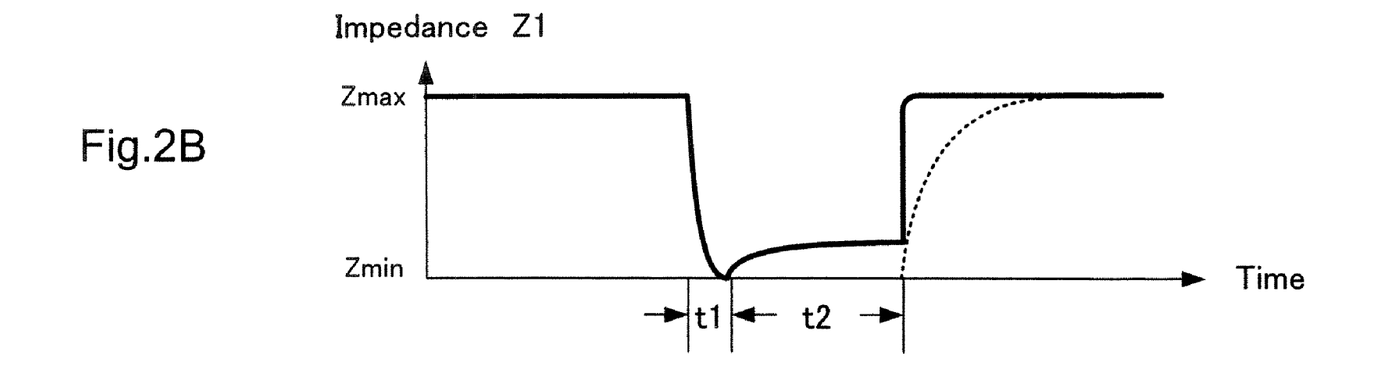
FIG. 2B is a graph of a waveform, illustrating the impedance characteristics of the switching element of the switching circuit of FIG. 1 and also the operation of the switching circuit.
Figure 2C:
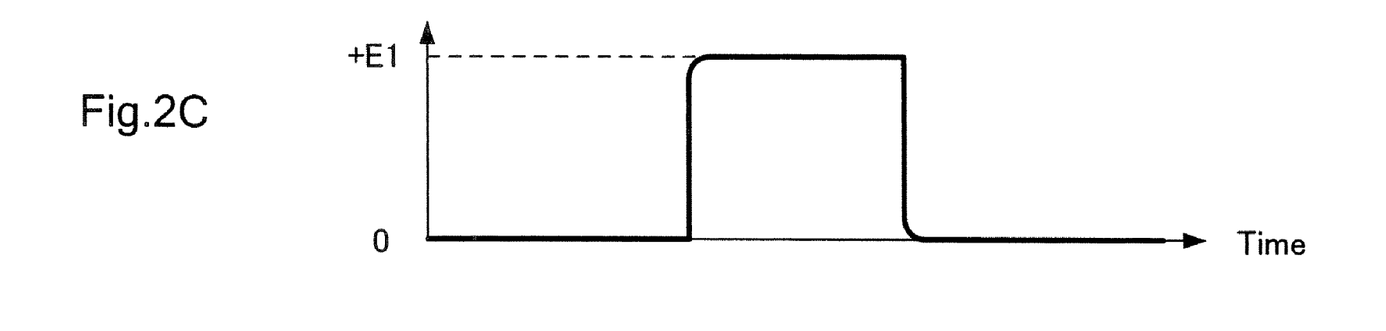
FIG. 2C is a graph of the waveform of the voltage between the opposite ends of a load circuit, illustrating the operation of a switching circuit of FIG. 1.

At this time, the impedance Z1 of the switching element 11 as viewed from the gate electrode G toward the transistors 12, 16 changes in a manner as illustrated in FIG. 2B. More specifically, as the transistor 12 rapidly comes into a conductive state in response to the rise of the pulse signal P1, the impedance Z1 abruptly falls to Zmin in time period t1 due to the short-circuiting of the transistor 12. Thereafter, while the transistor 12 becomes non-conductive, the transistor 16 stably comes into a conductive state so that the impedance Z1 shows an impedance value that is determined as a function of the resistor 15 and is stabilized in time period t2.

Thus, the switching element 11 is also switched from OFF to ON in response to the change in the impedance Z1 of the gate electrode G. As a result, it is possible to apply a voltage showing good rising characteristics to the opposite ends of the load circuit 25 as shown in FIG. 2C.

On the other hand, as level of the pulse signal P1 is shifted from level High to level Low, the base current no longer flows to the transistor 16 so that the transistor 16 is moved from a conductive state into a non-conductive state according to its own response characteristics, although the transistor 12 remains in a non-conductive state. Thus, as a result, the switching element 11 is turned OFF so that the voltage E1 is no longer supplied to the load circuit 26 from the constant voltage source 21.

At this time, the impedance Z1 of the gate electrode of the switching element 11 rises from the level of the impedance value that is determined as a function of the resistor 15 to the level of impedance of Zmax, that is the level when the transistor 16 is OFF but the time period required by the switching element 11 to turn from ON to OFF is shortened because of the impedance of the resistor 15 as shown in FIG. 2B.

If the resistor 15 is not provided, there is a large electric current flowing to the transistor 16 when the switching element 11 is turned ON so that it takes time for the element 11 to move into an OFF state. However, due to the provision of the resistor 15, it is possible to suppress the flow of the large electric current so that the transistor 16 can easily be moved from an ON state into an OFF state. Note that the ON resistance of the switching element 11 increases if the value of the resistor 15 is too large. Therefore, it is necessary to avoid selecting a too large value for the resistor 15.

Thus, as shown in FIG. 2C, the voltage between the opposite ends of the load circuit 25 also falls with good falling characteristics. The dotted line in FIG. 2B is the impedance curve when the resistor 15 is not provided.

As described above, with the above described switching circuit according to the present invention, the voltage between the opposite ends of the load circuit 25 shows a good rise under the effect of the differential circuit 31 and falls sharply under the effect of the resistor 15. As a result, according to the present invention, it is possible to provide a switching circuit showing a fast response speed relative to a pulse signal P1 applied to the control signal terminal 23.

The switching circuit 10 can find applications typically in pulse radar apparatus. Then, it is connected to the power amplifier of the pulse radar transmitter that operates as load circuit 25. A pulse signal P1 is supplied to the control signal terminal 23 at the transmission timing of the pulse radar transmitter and the switching element 11 is made conductive only during the pulse signal P1 period so that a DC voltage E1 is supplied from the constant voltage source 24 to the power amplifier only. With this arrangement, it is possible to drive the power amplifier only during the transmission period of the pulse radar transmitter.

The power consumption will be enormous if the supply voltage is supplied constantly to the power amplifier. However, the power consumption can be reduced by supplying the supply voltage to the power amplifier only during the period during which the pulse radar transmitter is driven for transmission. Additionally, the transmission timing can be set appropriately by improving the switching characteristics of the switching circuit 10.

Figure 3:
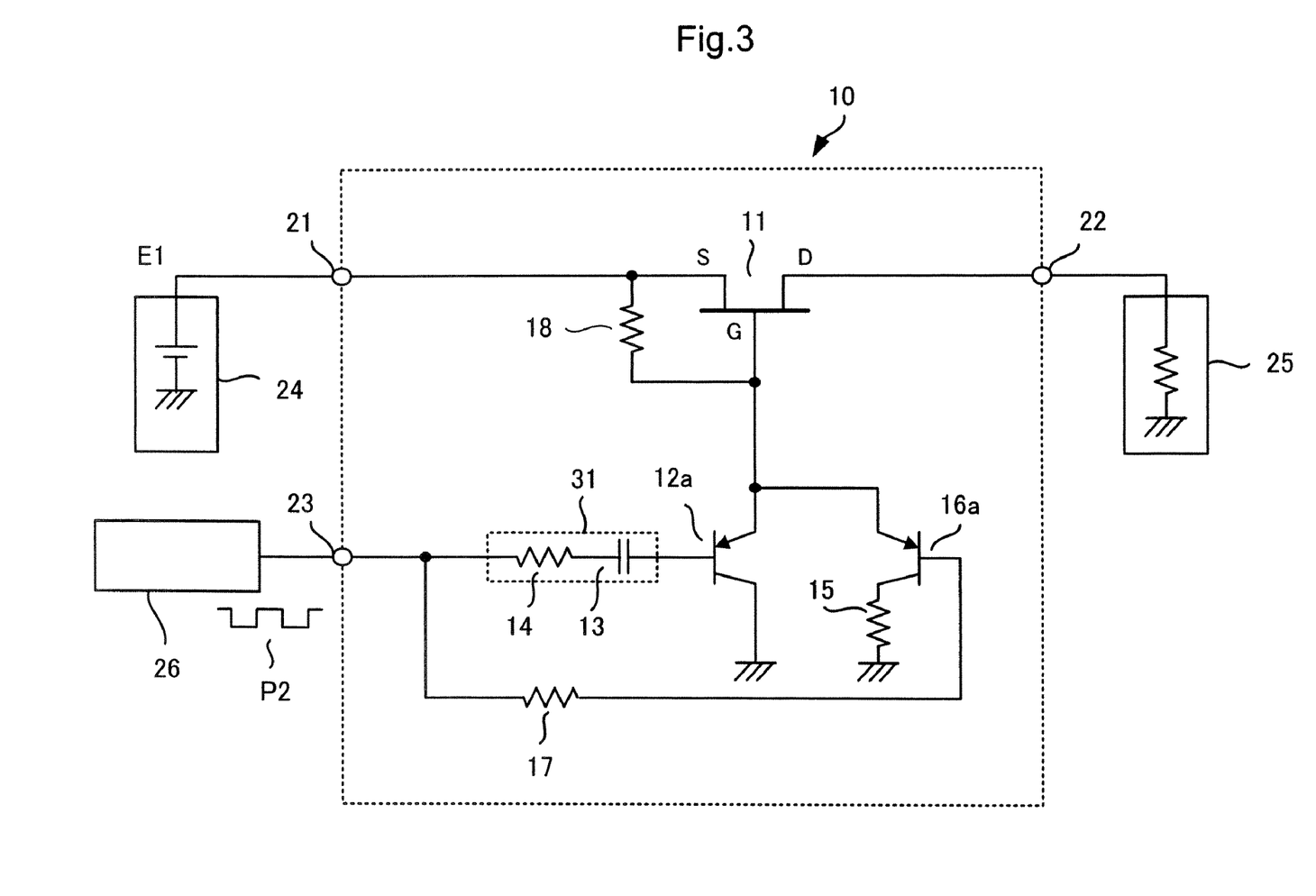
FIG. 3 is a schematic circuit diagram of a switching circuit obtained by modifying the embodiment of the present invention of FIG. 1.

FIG. 3 is a schematic circuit diagram of a switching circuit obtained by modifying the embodiment of the present invention of FIG. 1. In the switching circuit of FIG. 3, PNP transistors 12a, 16a are arranged to control the switching element 11. The emitter of the transistor 12a is connected to the gate electrode of the switching element 11 and the collector of the transistor 12a is connected to the reference potential point. On the other hand, the emitter of the transistor 16a is connected to the gate electrode of the switching element 11 and the collector of the transistor 16a is connected to the reference potential point by way of a resistor 15. The resistor 15 operates same as the resistor 15 of FIG. 1.

In this modified embodiment, the polarities of the control signal P2 supplied from the control signal terminal 23 to the bases of the transistors 12a, 16a are inverted relative to those of the control signal P1 of the embodiment of FIG. 1. In other words, the switching element 11 is held OFF during the period when the pulse signal P2 is at level High and the switching element 11 is held ON during the period when the pulse signal P2 is at level Low. In the instance of FIG. 3 again, the voltage between the opposite ends of the load circuit 25 rises and falls excellently under the effect of the differential circuit 31 and that of the resistor 15.

Figure 4:
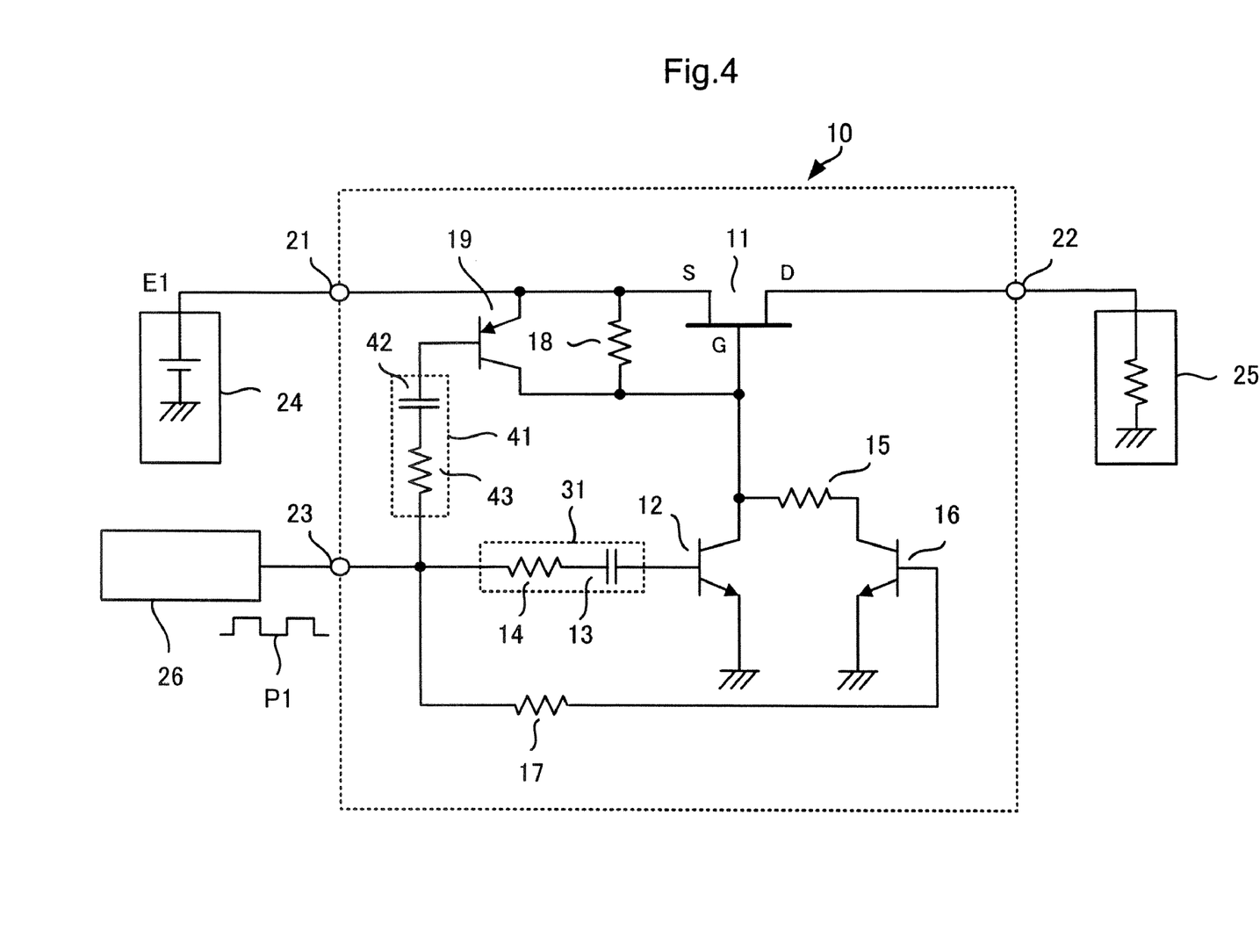
FIG. 4 is a schematic circuit diagram of another embodiment of a switching circuit according to the present invention.

FIG. 4 is a schematic circuit diagram of another embodiment of switching circuit according to the present invention. The embodiment of switching circuit of FIG. 4 is formed by adding a differential circuit 41 and a PNP transistor 19 to the circuit of FIG. 1 to further improve the falling characteristics of the voltage between the opposite ends of the load circuit 25.

The emitter-collector path of the transistor 19 is connected in parallel with the resistor 18 and the differential circuit 41, which is a series circuit of a capacitor 42 and a resistor 43, is connected between the base of the transistor 19 and the control signal terminal 23.

The pulse signal P1 is supplied from the control signal terminal 23 to the base of the transistor 19 and there flows a base current to the transistor 19 by way of the differential circuit 41 at the rising time of the pulse signal P1 to hold the transistor 19ON for a short period of time. With this arrangement, the voltage between the opposite ends of the load circuit 25 falls further quickly. In other words, the rising characteristics are improved by means of the differential circuit 31 while the falling characteristics are improved further by means of the resistor 15 and the differential circuit 41.

In FIG. 4, again, the transistors 12, 16 may be replaced by PNP type transistors as in the case of FIG. 3. In the instance of FIG. 4, it is sufficient to use a PNP type transistor for the transistor 19.

Figure 5:
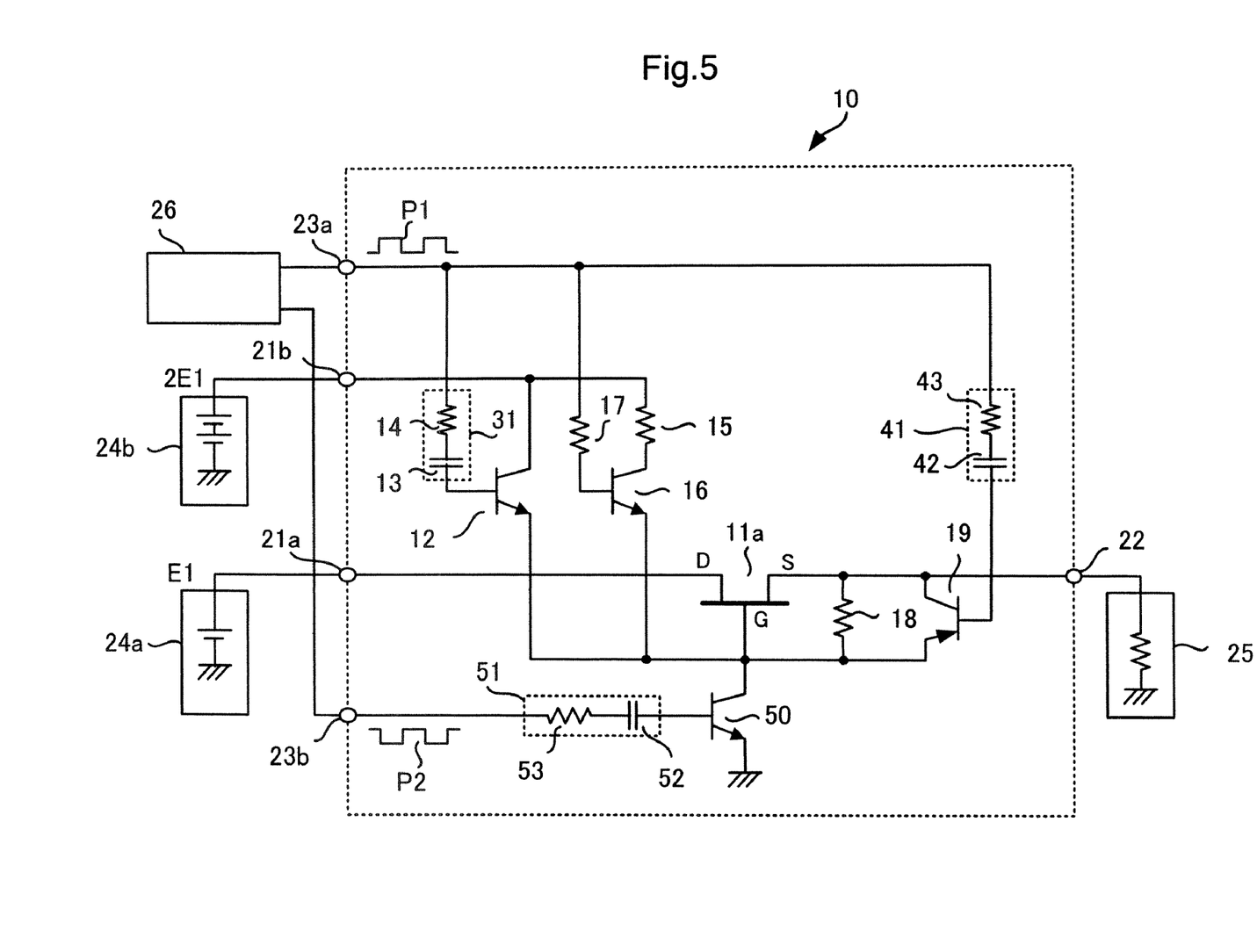
FIG. 5 is a schematic circuit diagram of still another embodiment of a switching circuit according to the present invention.

FIG. 5 is a schematic circuit diagram of still another embodiment of a switching circuit according to the present invention. In FIG. 5, an N-channel MOS type FET 11a is used as switching element. The configuration of this embodiment slightly differs from that of the embodiment of FIG. 1 because it is necessary to supply a control signal showing a voltage level higher than the voltage between the drain and the source electrodes to the gate electrode for switching operations when an N-channel FET is used as switching element.

Referring to FIG. 5, 10 denotes the switching circuit in which the main conduction path (drain-source current path) of its semiconductor switching element 11a is connected between its input terminal 21a and its output terminal 22. A DC voltage E1 is supplied from a constant voltage source 24a to the input terminal 21a. In this embodiment, an N-channel MOS type FET is used for the semiconductor switching element 11a. Of the semiconductor switching element 11a, the input electrode (drain electrode D) is connected to the input terminal 21a and the output electrode (source electrode S) is connected to the output terminal 22.

The switching element 11a performs a switching operation according to the control signal supplied to the control electrode (gate electrode). The emitter of an NPN transistor 12 is connected to the gate electrode G. The collector of this transistor 12 is connected to a constant voltage source 24b, while the base of the transistor 12 is connected to one of the opposite ends of a differential circuit 31 that includes a capacitor 13 and a resistor 14. The other end of the differential circuit 31 is connected to a control signal terminal 23a. The constant voltage source 24a supplies a voltage that is higher than the voltage E1 (e.g., a voltage of 2E1) to the terminal 21b.

The gate electrode of the switching element 11a is connected to the emitter of the transistor 16, while the collector of the transistor 16 is connected to the constant voltage source 24b by way of a resistor 15. The base of the transistor 16 is connected to the control signal terminal 23a by way of a resistor 17 and a resistor 18 is connected between the source electrode S and the gate electrode G of the switching element 11a.

The emitter-collector path of a transistor 19 is connected in parallel with the resistor 18 and a differential circuit 41 that is a series circuit of a capacitor 42 and a resistor 43 is connected between the base of the transistor 19 and the control signal terminal 23a.

Also referring to FIG. 5, the collector-emitter path of an NPN transistor 50 is connected between the gate electrode of the switching element 11a and the reference potential point and the base of the transistor 50 is connected to one of the opposite ends of a differential circuit 51 that is a series circuit of a capacitor 52 and a resistor 53. A pulse signal P2 is supplied to the other end of the differential circuit 51 from a control signal source 26 by way of a control signal terminal 23b. The pulse signal P2 is a signal synchronized with the pulse signal P1 but shows polarities inverted relative to those of the pulse signal P1.

The operation of the embodiment of FIG. 5 is basically same as that of FIG. 1. A pulse signal P1 is applied from the control signal terminal 23a as control signal and, as the level of the pulse signal P1 is shifted from level Low to level High, a base current flows to the base of the transistor 12 by way of the differential circuit 31 that includes the resistor 14 and the capacitor 13. The base current flows until the capacitor 13 is electrically charged and the transistor 12 comes into a conductive state at high speed in response to the rise of the pulse signal P1 but then moves into a non-conductive state. At the same time, the pulse signal P1 is also supplied to the base of the transistor 16 by way of the resistor 17 and the transistor 16 comes into a conductive state slightly later than the transistor 12. As a result, the switching element 11a becomes ON and the voltage E1 of the constant voltage source 24a is supplied to the load circuit 25.

On the other hand, when the level of the pulse signal P1 is shifted from level High to level Low, the base current no longer flows to the transistor 16 and hence the transistor 16 moves into a non-conductive state, although the transistor 12 remains in the non-conductive state. As a result, the switching element 11a is turned OFF and the voltage E1 is no longer supplied from the constant voltage source 24a to the load circuit 25.

The differential circuit 31 of FIG. 5 exerts a good effect on the rise of the voltage between the opposite ends of the load circuit 25 as its counterpart of FIG. 1 while the resistor 15 exerts a good effect on the fall of the voltage between the opposite ends of the load circuit 25 as its counterpart of FIG. 1. Therefore, the load circuit shows characteristics similar to those illustrated in FIG. 2C. The differential circuit 41 of FIG. 5 exerts an effect similar to that of the differential circuit 41 of FIG. 4. More specifically, the base current flows to the transistor 19 by way of the differential circuit 41 at a fall of the pulse signal P1 to cause the voltage between the opposite ends of the load circuit 25 to fall further faster.

When the level of the pulse signal P2 is shifted from level Low to level High, (and the level of the pulse signal P1 is shifted from level High to level Low), the transistor 50 becomes conductive for a short period of time to accelerate the move of the switching element 11a from an ON state into an OFF state.

Thus, with the switching circuit of FIG. 5, the voltage between the opposite ends of the load circuit 25 shows a good rise under the effect of the differential circuit 31 and falls sharply under the effect of the resistor 15 and the differential circuit 41. As a result, according to the present invention, it is possible to provide a switching circuit showing a fast response speed relative to a pulse signal P1 applied to the control signal terminal 23a. Additionally, as a result of the use of an N-channel switching element 11a, it is possible to reduce the ON resistance of the switching element 11a and hence provide a switching circuit that shows a fast response speed. Note that, in FIG. 5, the differential circuits 41, 51 and the transistors 19, 50 are not indispensable and hence may be provided only when necessary.

While pulse radar apparatus are cited above as applications of a switching circuit according to the present invention, a switching circuit according to the invention can also find applications in other electronic apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the present invention.

What is claimed is:

1. A switching circuit comprising:
    a semiconductor switching element having an input electrode, an output electrode and a control electrode, the input electrode being connected to a voltage source, the output electrode being connected to a load circuit;
    a first transistor with its collector-emitter path connected between the control electrode of the semiconductor switching element and a reference potential point;
    a series circuit including a second transistor and a first resistor connected to a collector-emitter path of the second transistor in series and connected to the first transistor in parallel;
    a control signal terminal configured to be supplied with a control signal shifting between a first level and a second level;
    a second resistor connected between the control signal terminal and a base of the second transistor; and
    a differential circuit including a first capacitor and a third resistor in series and connected between the control signal terminal and a base of the first transistor,
    wherein the semiconductor switching element is controlled for ON/OFF in response to the control signal.

2. The switching circuit according to claim 1, wherein the semiconductor switching element is a P-channel MOS type FET and the first and second transistors are NPN transistors,
    the collector of the first transistor being connected to the control electrode of the semiconductor switching element, the collector of the second transistor being connected to the control electrode of the semiconductor switching element by way of the first resistor, the emitters of the first and second transistors being connected to the reference potential point.

3. The switching circuit according to claim 1, wherein the semiconductor switching element is a P-channel MOS type FET and the first and second transistors are PNP transistors, the collector of the first transistor being connected to the reference potential point, the collector of the second transistor being connected to the reference potential point by way of the first resistor, the emitters of the first and second transistors being connected to the control electrode of the semiconductor switching element.

4. The switching circuit according to claim 1, wherein when an impedance of the control electrode of the semiconductor switching element changes between a maximum value Zmax and a minimum value Zmin as a result of ON/OFF of the semiconductor switching element, a value of the first resistor is set to a level close to the minimum value Zmin.

5. The switching circuit according to claim 1, wherein the load circuit is a pulse radar transmitter, and a pulse signal is supplied as the control signal at a transmission timing of the pulse radar transmitter to make the semiconductor switching element conductive only during a pulse signal period and a DC voltage from the voltage source is supplied to the pulse radar transmitter.

6. A switching circuit comprising:

a semiconductor switching element having an input electrode, an output electrode and a control electrode, the input electrode being connected to a voltage source, the output electrode being connected to a load circuit;

a first transistor with its collector-emitter path connected between the control electrode of the semiconductor switching element and a reference potential point;

a series circuit including a second transistor and a first resistor connected to a collector-emitter path of the second transistor in series and connected to the first transistor in parallel;

a control signal terminal configured to be supplied with a control signal shifting between a first level and a second level;

a second resistor connected between the control signal terminal and a base of the second transistor;

a first differential circuit including a first capacitor and a third resistor in series and connected between the control signal terminal and a base of the first transistor so as to make the first transistor conductive at a time of the level shift of the control signal from the first level to the second level;

a parallel circuit including a fourth resistor connected between the input electrode and the control electrode of the semiconductor switching element and a third transistor with its emitter-collector path connected to the fourth resistor in parallel; and a second differential circuit including a second capacitor and a fifth resistor in series and connected between the control signal terminal and a base of the third transistor so as to make the third transistor conductive at a time of the level shift of the control signal from the second level to the first level, wherein the semiconductor switching element is controlled for ON/OFF in response to the control signal.

7. The switching circuit according to claim 6, wherein the semiconductor switching element is a P-channel MOS type FET and the first and second transistors are NPN transistors, while the third transistor is a PNP transistor, the collector of the first transistor being connected to the control electrode of the semiconductor switching element, the collector of the second transistor being connected to the control electrode of the semiconductor switching element by way of the first resistor, the emitters of the first and second transistors being connected to the reference potential point, the emitter of the third transistor being connected to the input electrode of the semiconductor switching element, the collector of the third transistor being connected to the control electrode of the semiconductor switching element.

8. The switching circuit according to claim 6, wherein the semiconductor switching element is a P-channel MOS type FET and the first and second transistors are PNP transistors, while the third transistor is an NPN transistor, the collector of the first transistor being connected to the reference potential point, the collector of the second transistor being connected to the reference potential point by way of the first resistor, the emitters of the first and second transistors being connected to the control electrode of the semiconductor switching element, the collector of the third transistor being connected to the input electrode of the semiconductor switching element, the emitter of the third transistor being connected to the control electrode of semiconductor switching element.

9. The switching circuit according to claim 6, wherein when an impedance of the control electrode of the semiconductor switching element changes between a maximum value Zmax and a minimum value Zmin as a result of ON/OFF of the semiconductor switching element, a value of the first resistor is set to a level close to the minimum value Zmin.

10. The switching circuit according to claim 6, wherein the load circuit is a pulse radar transmitter, and a pulse signal is supplied as the control signal at a transmission timing of the pulse radar transmitter to make the semiconductor switching element conductive only during a pulse signal period and a DC voltage from the voltage source is supplied to the pulse radar transmitter.

11. A switching circuit comprising:

a semiconductor switching element having an input electrode, an output electrode and a control electrode, the input electrode being connected to a first voltage source, the output electrode being connected to a load circuit;

a first transistor with its collector-emitter path connected between the control electrode of the semiconductor switching element and a second voltage source;

a series circuit including a second transistor and a first resistor connected to a collector-emitter path of the second transistor in series and connected to the first transistor in parallel;

a control signal terminal configured to be supplied with a control signal shifting between a first level and a second level;

a second resistor connected between the control signal terminal and a base of the second transistor; and a first differential circuit including a first capacitor and a third resistor in series and connected between the control signal terminal and a base of the first transistor, wherein a voltage of the second voltage source is set to be higher than a voltage of the first voltage source, the semiconductor switching element being controlled for ON/OFF in response to the control signal.

12. The switching circuit according to claim 11, wherein the semiconductor switching element is an N-channel MOS type FET and the first and second transistors are NPN transistors, the collector of the first transistor being connected to the second voltage source, the collector of the second transistor being connected to the second voltage source by way of the first resistor, the emitters of the first and second transistors being connected to the control electrode of the semiconductor switching element.

13. The switching circuit according to claim 11, further comprising:

a parallel circuit including a fourth resistor connected between the output electrode and the control electrode of the semiconductor switching element and a third transistor having its emitter-collector path connected in parallel with the third resistor; and a second differential circuit including a second capacitor and a fifth resistor in series and connected between the control signal terminal and a base of the third transistor, wherein the first differential circuit is adapted to make the first transistor conductive at a time of a shift of the level of the control signal from the first level to the second level, and the second differential circuit is adapted to make the third transistor conductive at a time of a shift of the level of the control signal from the second level to the first level.

14. The switching circuit according to claim 13, further comprising:

a fourth transistor having its collector-emitter path connected between the control electrode of the semiconductor switching element and the reference potential point; and a third differential circuit including a third capacitor and a sixth resistor in series and connected between a second control signal terminal to be supplied with a control signal showing polarities inverted relative to those of the control signal and the base of the fourth transistor.

15. The switching circuit according to claim 11, wherein when an impedance of the control electrode of the semiconductor switching element changes between a maximum value Zmax and a minimum value Zmin as a result of ON/OFF of the semiconductor switching element, a value of the first resistor is set to a level close to the minimum value Zmin.

16. The switching circuit according to claim 11, wherein a voltage of the second voltage source is twice as high as a voltage of the first voltage source.

17. The switching circuit according to claim 11, wherein the load circuit is a pulse radar transmitter, and a pulse signal is supplied as the control signal at a transmission timing of the pulse radar transmitter to make the semiconductor switching element conductive only during a pulse signal period and a DC voltage from the first voltage source is supplied to the pulse radar transmitter.

* * * * *